United States Patent
Park et al.

(10) Patent No.: US 7,880,829 B2
(45) Date of Patent: Feb. 1, 2011

(54) BEZEL SUPPORT FOR FLAT PANEL DISPLAY

(75) Inventors: Hong-Sik Park, Suwon-si (KR);
Sang-Hyun Lee, Suwon-si (KR);
Dong-Ho Kim, Suwon-si (KR)

(73) Assignee: Samsung Mobile Display Co., Ltd.,
Giheung-Gu, Yongin, Gyunggi-Do (KR)

( * ) Notice: Subject to any disclaimer, the term of this patent is extended or adjusted under 35 U.S.C. 154(b) by 48 days.

(21) Appl. No.: 12/318,914

(22) Filed: Jan. 12, 2009

(65) Prior Publication Data

US 2009/0213292 A1    Aug. 27, 2009

(30) Foreign Application Priority Data

Feb. 21, 2008    (KR)    ................. 10-2008-0015823

(51) Int. Cl.
*H05K 5/00* (2006.01)
*G06F 1/16* (2006.01)
*G02F 1/1335* (2006.01)
*G02F 1/1333* (2006.01)

(52) U.S. Cl. ............... 349/58; 361/679.02; 361/679.21; 248/917; 349/64; 345/905

(58) Field of Classification Search ................. 361/679.01–679.45, 679.57, 679.58, 667, 361/671; 349/58; 313/33, 46; 248/125.9, 248/920, 176.1; 40/601
See application file for complete search history.

(56) References Cited

U.S. PATENT DOCUMENTS 6,120,118 A * 9/2000 Dean ................. 312/223.2
6,532,152 B1 * 3/2003 White et al. ............. 361/692
6,801,268 B2 10/2004 Huang et al.
2006/0073891 A1 * 4/2006 Holt ......................... 463/30
2006/0139271 A1 * 6/2006 Okuda ..................... 345/88
2009/0201438 A1 * 8/2009 Kim et al. ................. 349/58

FOREIGN PATENT DOCUMENTS

| JP | 2002-215051 | 7/2002 |
| KR | 10-2004-0111313 | 12/2004 |
| KR | 10-20050026736 A | 3/2005 |
| KR | 10-2005-0051364 | 6/2005 |
| KR | 10-2005-0070555 | 7/2005 |
| KR | 10-0759673 B1 | 9/2007 |
| KR | 10-0759674 | 9/2007 |
| KR | 10-0769425 B1 | 10/2007 |

OTHER PUBLICATIONS

Korean Notice of Allowance issued on Jan. 28, 2010, corresponding to Korean Patent Application No. 10-2008-0015823.

* cited by examiner

*Primary Examiner*—Zachary M Pape
*Assistant Examiner*—Jerry Wu
(74) *Attorney, Agent, or Firm*—Robert E. Bushnell, Esq.

(57) ABSTRACT

A flat panel display device includes a folded bezel formed in a multi-layer structure. The flat panel display device is formed so that an electronic component of a flexible printed circuit board may be inserted into at least one opening formed at a location where the layers of the bezel correspond to one another. Thus, the electronic component inserted into the opening of the bezel has improved durability against external interference and impact, and the number of components and the number of processes can be reduced.

14 Claims, 4 Drawing Sheets

BEZEL SUPPORT FOR FLAT PANEL DISPLAY

CLAIM OF PRIORITY

This application makes reference to, incorporates the same herein, and claims all benefits accruing under 35 U.S.C. §119 from an application for Flat Panel Display earlier filed in the Korean Intellectual Property Office on the 21 Feb. 2008 and there duly assigned Serial No. 10-2008-0015823.

BACKGROUND OF THE INVENTION

1. Technical Field

The present invention relates to a flat panel display device and, more particularly, to a flat panel display device including a bezel formed in a multi-layer structure.

2. Related Art

Generally, flat panel display (FPD) devices, such as a liquid crystal display (LCD) device, a field emission display (FED) device, and an organic light emitting diode (OLED) display device, are accommodated in a bezel which functions as a frame so as to mechanically and electrically protect the FPDs.

In this regard, when an opening is formed in the bezel, and an electronic component of a flexible circuit board is inserted thereinto, the electronic component can be protected against breakage due to external interference and impact. However, the thickness of the bezel is limited, and must be kept smaller due to the trend toward slim display devices. Thus, an auxiliary bezel is separately disposed in the bezel, an opening is formed at a location where the bezel and the auxiliary bezel correspond to each other, and the electronic component of the flexible circuit board may be inserted into the opening.

In this regard, processes for forming the auxiliary bezel and fixing the bezel to the auxiliary bezel by an adhesive tape have to be added so as to include the auxiliary bezel. Moreover, the tape is manually aligned and attached to an opening position of the bezel by an operator so that processing time is prolonged and accuracy is degraded.

SUMMARY OF THE INVENTION

The present invention provides a flat panel display device, including a bezel formed in a multi-layer structure, which extends from one side of a substrate part and is folded.

In an exemplary embodiment of the present invention, a flat panel display device comprises: a bezel including a first substrate part having a bent part at an edge, and a second substrate part extending from one side of the first substrate part and folded; a flat display panel accommodated in the first substrate part of the bezel, and including a pad part and a plurality of pixels; and a flexible printed circuit board connected to the pad part and fixed to the second substrate part of the bezel; wherein the first substrate part and the second substrate part have at least one opening at a location where the first and second substrate parts correspond to each other.

In another exemplary embodiment of the present invention, a flat panel display device comprises: a bezel including a first substrate part having a bent part at an edge, a second substrate part extending from one side of the first substrate part and folded, and a third substrate part extending from one side of the second substrate part and folded; a flat display panel accommodated in the first substrate part of the bezel, and including a pad part and a plurality of pixels; and a flexible printed circuit board connected to the pad part and fixed to the third substrate part of the bezel; wherein the first, second and third substrate parts have at least one opening at a location where the first, second and third substrate parts correspond to one another.

BRIEF DESCRIPTION OF THE DRAWINGS

A more complete appreciation of the present invention, and many of the attendant advantages thereof, will be readily apparent as the present invention becomes better understood by reference to the following detailed description when considered in conjunction with the accompanying drawings in which like reference symbols indicate the same or similar components, wherein.

DETAILED DESCRIPTION OF THE INVENTION

Figure 1:
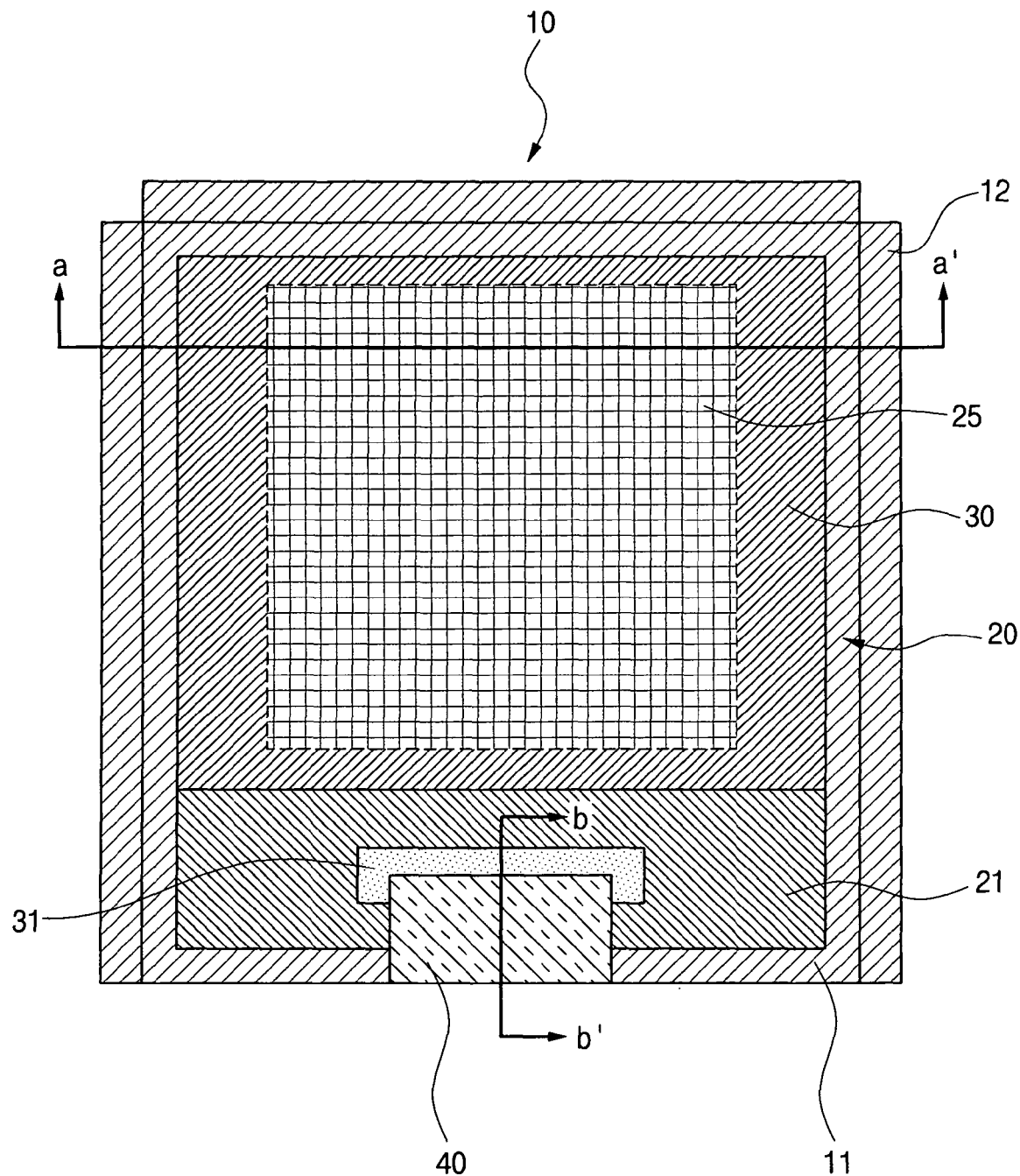
FIG. 1 is a plan view of a flat panel display device according to a first exemplary embodiment of the present invention.

The present invention will now be described more fully hereinafter with reference to the accompanying drawings, in which exemplary embodiments of the invention are shown. In the drawings, lengths and thicknesses of layers and regions may be exaggerated for clarity. Furthermore, like numerals denote like elements throughout the specification.

Exemplary Embodiment 1

Figure 2:
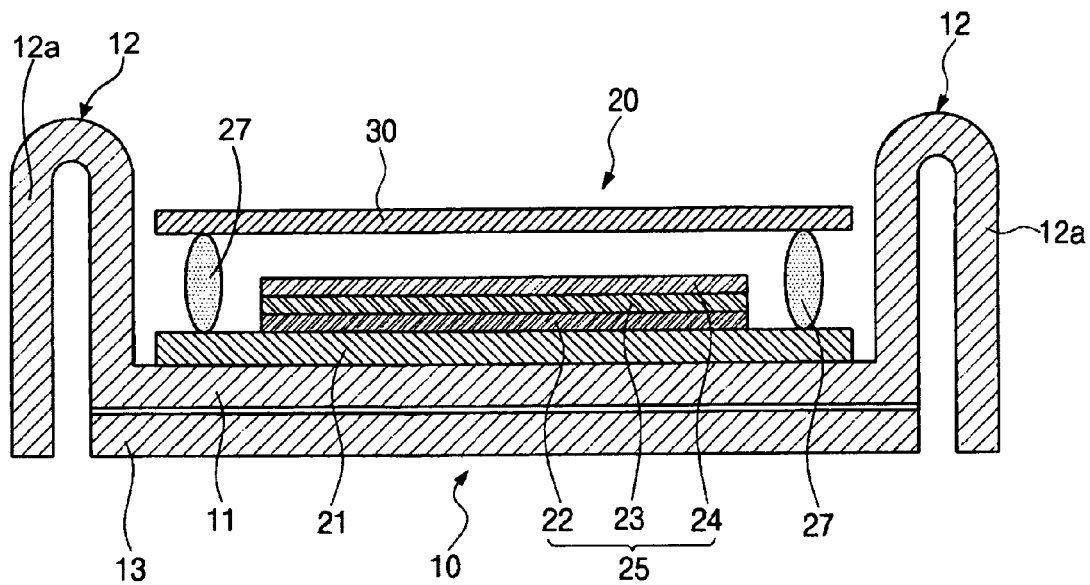
FIG. 2 is a cross-sectional view taken along line a-a' of FIG. 1.

FIG. 1 is a plan view according to a first exemplary embodiment of the present invention, and FIG. 2 is a cross-sectional view taken along line a-a' of FIG. 1.

Referring to FIGS. 1 and 2, a flat panel display device includes a bezel 10, a flat display panel 20 and a flexible printed circuit board (FPCB) 40.

The bezel 10 includes a first substrate part 11 supporting the flat display panel 20, and a second substrate part 13 which extends from one side of the first substrate part 11 and is folded.

The first substrate part 11 is bent at both edges in the same direction, thereby forming bent parts 12. Thus, the first substrate part 11 and the bent parts 12 may be formed of the same material.

The first substrate part 11 serves as a frame supporting and fixing the flat display panel 20. The first substrate part 11 is generally formed of a conductive metallic material, and is connected to the flat display panel 20 and a ground terminal of the FPCB 40, so that electrical reliability is improved.

The bent parts 12 are formed by bending the first substrate part 11 in the same direction at both edges, which are bent in a vertical direction in the first exemplary embodiment of the present invention.

Thus, the flat display panel 20 is accommodated in the first substrate part 11 having the bent parts 12, so that the flat display panel 20 is protected from external impact.

In this respect, the bent parts 12 may further have hemming structures 12a, which are formed by folding the bent part 12, for mechanical strength. Preferably, outside hemming structures 12a are formed so that the bent parts 12 are folded outside the bezel 10.

The second substrate part 13 extends from one side of the first substrate part 11 and is folded, and thus the first and second substrate parts, 11 and 13, respectively, are formed of the same material.

The bezel 10 is formed in a double-layer structure of the first and second substrate parts 11 and 13, respectively, so as to form the height of an opening into which an electronic component of the FPCB 40 will be inserted. More detailed description will be provided below with reference to FIGS. 3 and 4.

The flat display panel 20 also includes a device substrate 21 on which a pixel region 25 having a plurality of pixels is formed, an encapsulation substrate 30 coupled to the device substrate 21, and a pad part 31 providing an electrical signal to drive the pixel.

The device substrate 21 may be formed of an insulating material, such as glass or plastic.

On the device substrate 21, pixel region 25 is formed of an organic light emitting diode and includes a first electrode 22 having a reflective layer (not illustrated) formed thereunder, an organic light emitting layer 23 formed on the first electrode 22, and a second electrode 24 formed on the organic light emitting layer 23.

While one organic light emitting diode is illustrated for convenience in describing FIG. 2, in practice, a plurality of pixels are formed in the pixel region 25.

In the latter regard, a hole injection layer and a hole transport layer may be formed between the organic light emitting layer 23 and the first electrode 22, and an electron transport layer and an electron injection layer may be formed between the organic light emitting layer 23 and the second electrode 24.

The encapsulation substrate 30 maybe formed of the same material as the device substrate 21, and edges of the device substrate 21 are coupled to the encapsulation substrate 30 by sealants 27 so as to protect the pixel region 25 formed therein from external air. As the sealants 27, a UV hardening agent or a thermal hardening agent such as epoxy may be used.

The organic light emitting diode may be an active-matrix organic light emitting diode, which further includes a thin film transistor including a semiconductor layer formed between the device substrate 21 and the first electrode 22, a gate electrode corresponding to the semiconductor layer, and source and drain electrodes electrically connected to the semiconductor layer.

The flat display panel 20 is attached and fixed to the first substrate part 11 of the bezel 10 by a cushion tape (not illustrated) having adhesive tapes at one and another surfaces thereof. The cushion tape may be formed of a PORON material.

The FPCB 40 is connected to the pad part 31 of the flat display panel 20, and the pad part 31 serves to provide an electrical signal to a data driver (not illustrated) and a scan driver (not illustrated) so as to drive the plurality of pixels in the pixel region 25 of the flat display panel 20.

The FPCB 40 is disposed at one side of the bezel 10, which maybe generally disposed at one short side.

Figure 3:
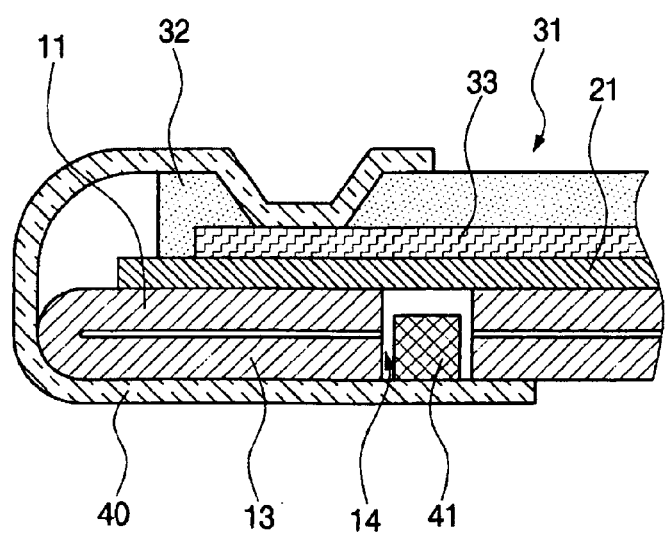
FIG. 3 is a cross-sectional view taken along line b-b' of FIG. 1.
Figure 4:
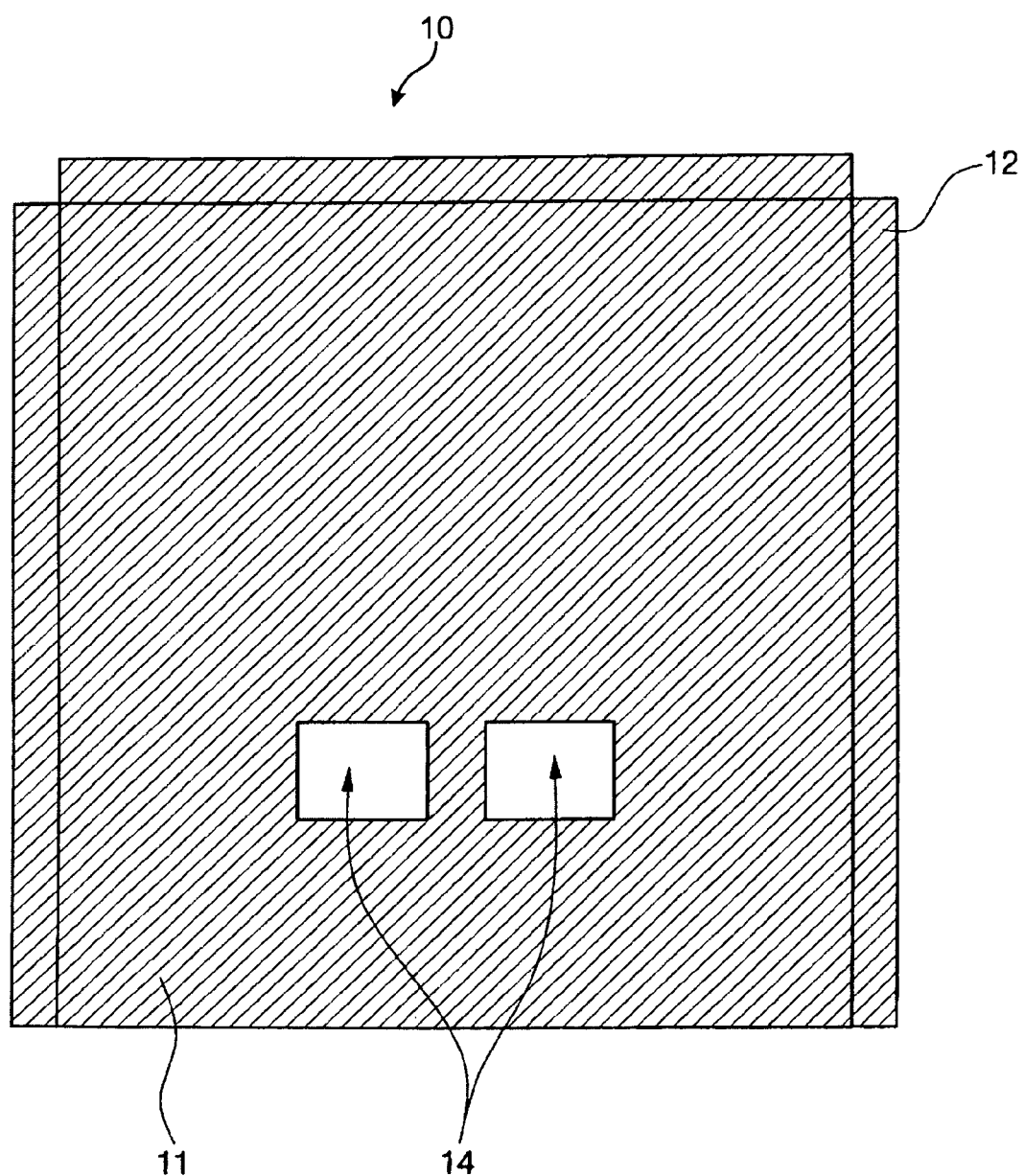
FIG. 4 is a plan view of a bezel according to the first exemplary embodiment of the present invention.

FIG. 3 is a cross-sectional view taken along line b-b' of FIG. 1, and FIG. 4 is a plan view of a bezel according to the first exemplary embodiment of the present invention.

Referring to FIGS. 3 and 4, a bezel 10 is formed in a double-layer structure including a first substrate part 11 and a second substrate part 13 which extends from one side of the first substrate part 11 and is folded.

At least one opening 14 is formed at a location where the first and second substrate parts 11 and 13, respectively, of the bezel 10 correspond to each other.

A device substrate 21 is formed, and a metal interconnection 33, connected to a pixel region 25 and transmitting a signal, is formed on the device substrate 21 in the pad part 31.

A passivation layer 32 is formed on the metal interconnection 33 in the pad part 31, and the metal interconnection 33 is connected with an FPCB 40 through a via hole in the passivation layer 32.

The FPCB 40 connected to the metal interconnection 33 is bent toward a back surface of the bezel 10, and is fixed to the second substrate part 13, which may be generally attached by an adhesive tape.

In this respect, an electronic component 41 mounted on the FPCB 40 is inserted into an opening 14, thereby being protected from external interference and impact.

Consequently, the bezel 10 having a double-layer structure can be formed as a thin bezel, and can have a folded structure, so that the bezel 10 can have a height sufficient for insertion of the electronic component 41.

Exemplary Embodiment 2

Figure 5:
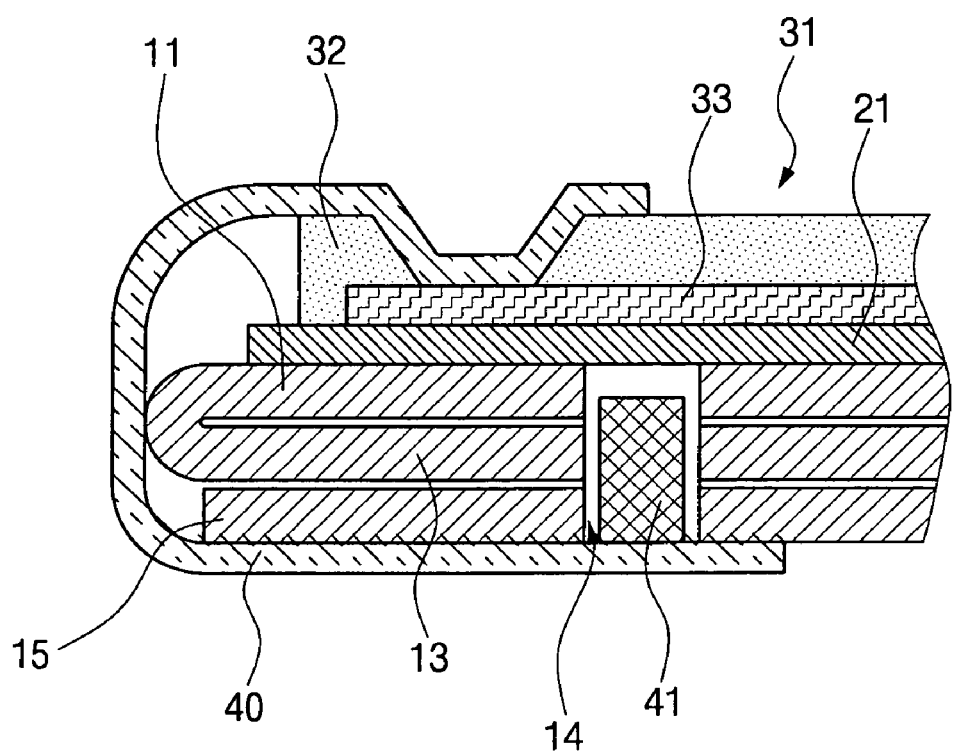
FIG. 5 is a cross-sectional view of a flat panel display device according to a second exemplary embodiment of the present invention.

FIG. 5 is a cross-sectional view of a flat panel display device according to a second exemplary embodiment of the present invention.

Referring to FIGS. 1 and 5, a flat panel display device includes a bezel 10, a flat display panel 20 and an FPCB 40.

In the second exemplary embodiment of the present invention, the configuration is the same as for the first exemplary embodiment, except for the bezel of the flat panel display device, and thus a description thereof will be omitted except for the bezel.

Referring to FIG. 5, the bezel is formed in a three-layer structure including a first substrate part 11, a second substrate part 13 which extends from one side of the first substrate part 11 and is folded, and a third substrate part 15 which extends from one side of the second substrate part 13 and is folded.

At least one opening 14 is formed at a location where the first, second and third substrate parts 11, 13 and 15, respectively, correspond to one another.

The FPCB 40 connected to a pad part 31 of the flat display panel 20 is fixed to the third substrate part 15, which may be generally attached by adhesive tape.

In this respect, electronic component 41 mounted on the FPCB 40 maybe inserted into the opening 14, thereby being protected from external interference and impact.

The bezel having a three-layer structure is formed using a thinner bezel, and has a folded structure, so that the bezel can have a height sufficient for the insertion of electronic component 41 so as to protect electronic component 41 having various sizes.

While the organic light emitting diode among the flat panel display devices is described in the exemplary embodiment of the present invention, the bezel structure may be applied to all types of flat panel display devices, such as a liquid crystal display (LCD) device and a field emission display (FED) device.

Furthermore, the bezel described above has a double-or three-layer structure, but it may be formed by folding the bezel more than three times.

Consequently, a flat panel display device according to the present invention can increase the durability of an electronic component, and can improve production efficiency by reducing the number of electronic components and the number of processes.

Although the present invention has been described with reference to specific exemplary embodiments thereof, it will be understood by those skilled in the art that a variety of modifications and variations may be made to the present invention without departing from the spirit or scope of the present invention as defined in the appended claims and their equivalents.

What is claimed is:

1. A flat panel display (FPD) device, comprising:
   a bezel including a first substrate part having a bent part at an edge thereof, and a second substrate part which extends from one side of the first substrate part and is folded;
   a flat display panel accommodated in the first substrate part of the bezel, and including a pad part and a plurality of pixels; and
   a flexible printed circuit board connected to the pad part and fixed to the second substrate part of the bezel,
   wherein the first substrate part and the second substrate part have at least one opening at a location where the first and second substrate parts correspond to each other.

2. The FPD device according to claim 1, wherein an electronic component is inserted into said at least one opening.

3. The FPD device according to claim 1, wherein the flexible printed circuit board is attached to the second substrate part of the bezel by an adhesive tape.

4. The FPD device according to claim 1, wherein the bent part has a hemming structure.

5. The FPD device according to claim 1, wherein the flat display panel is attached to the first substrate part of the bezel by a cushion tape having adhesive tapes on one surface and another surface thereof.

6. The FPD device according to claim 5, wherein the cushion tape is formed of a PORON material.

7. The FPD device according to claim 1, wherein the bezel is formed of a conductive metallic material.

8. A flat panel display (FPD) device, comprising:
   a bezel including a first substrate part having a bent part at an edge thereof, a second substrate part which extends from one side of the first substrate part and is folded, and a third substrate part which extends from one side of the second substrate part and is folded;
   a flat display panel accommodated in the first substrate part of the bezel, and including a pad part and a plurality of pixels; and
   a flexible printed circuit board connected to the pad part and fixed to the third substrate part of the bezel;
   wherein the first, second and third substrate parts have at least one opening at a location where the first, second and third substrate parts correspond to one another.

9. The FPD device according to claim 8, wherein an electronic component is inserted into said at least one opening.

10. The FPD device according to claim 8, wherein the flexible printed circuit board is attached to the third substrate part of the bezel by an adhesive tape.

11. The FPD device according to claim 8, wherein the bent part has a hemming structure.

12. The FPD device according to claim 8, wherein the flat display panel is attached to the bezel by a cushion tape having adhesive tapes on one surface and another surface thereof.

13. The FPD device according to claim 12, wherein the cushion tape is formed of a PORON material.

14. The FPD device according to claim 8, wherein the bezel is formed of a conductive metallic material.

* * * * *